United States Patent [19]

Layton

[11] 4,198,688
[45] Apr. 15, 1980

[54] THERMAL CONTROL MEMBERS, BUBBLE MEMORY

[75] Inventor: Wilbur T. Layton, San Diego, Calif.

[73] Assignee: Burroughs Corporation, Detroit, Mich.

[21] Appl. No.: 933,055

[22] Filed: Aug. 11, 1978

[51] Int. Cl.² ............................................. G11C 5/04
[52] U.S. Cl. .................................................... 365/2
[58] Field of Search ........................................... 365/2

[56] References Cited

U.S. PATENT DOCUMENTS

| 4,096,581 | 6/1978 | Carlo et al. | 365/2 |
| 4,101,970 | 7/1978 | Saito et al. | 365/2 |

*Primary Examiner*—James W. Moffitt
*Attorney, Agent, or Firm*—Joseph R. Dwyer; Kevin R. Peterson

[57] ABSTRACT

A package having bubble memory components including bubble memory chips or modules disposed between bias magnets for maintaining and establishing bubbles in said chips, field drive coils for propagating the bubbles therein and further including thermal control means for stabilizing and dissipating the heat generated in the package and which also aid in the packaging of the components. The thermal control means include discrete compliant members of thermally conductive material which also aid in the assembly of the package, additional thermal members and spacing means both also of thermally conductive material which locate the chips relative to the bias magnets.

12 Claims, 2 Drawing Figures

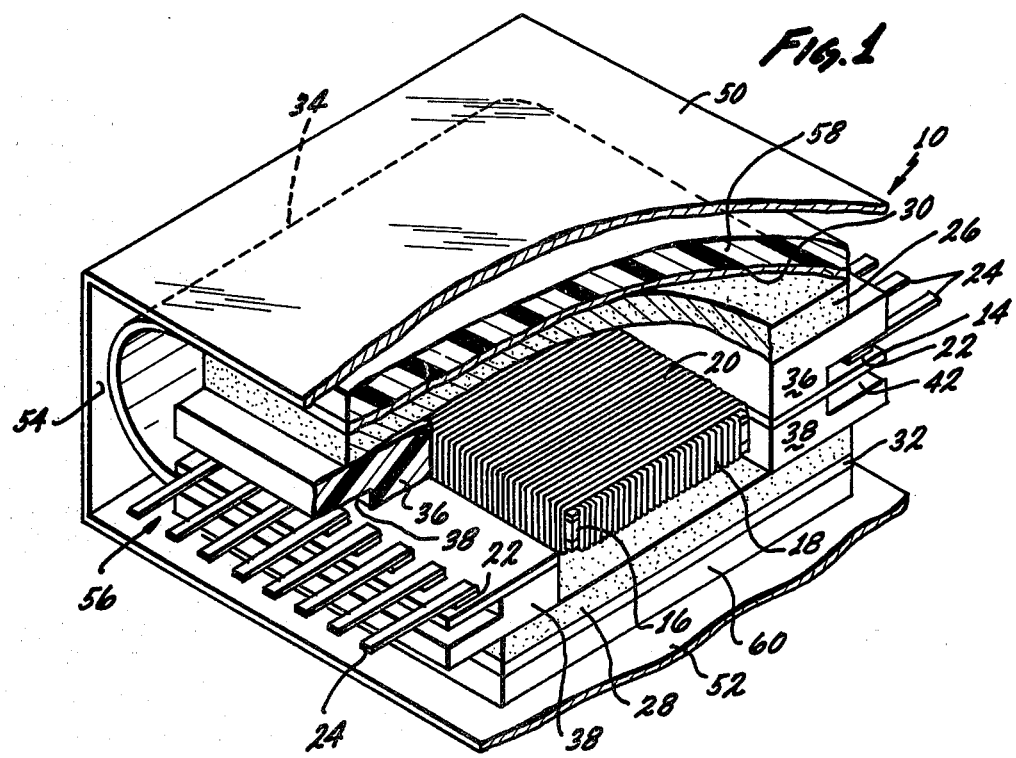
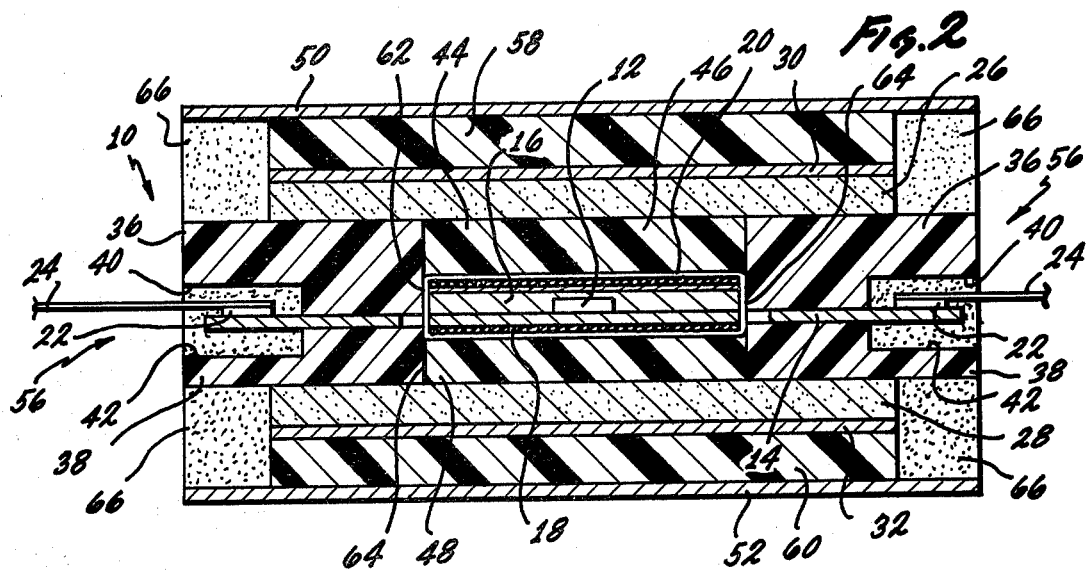

THERMAL CONTROL MEMBERS, BUBBLE MEMORY

BACKGROUND OF THE INVENTION

This invention relates to magnetic bubble (domain) assemblies and more particularly to a magnetic bubble package arrangement having improved heat control and packaging capabilities.

A magnet bubble package comprises one or more chips or modules containing a layer of garnet-like material formed on a substrate and disposed between bias magnets to provide a bias field normal to the plane of the substrate to establish and maintain bubbles in the garnet-like material. For bubble propagation in the plane of the ferromagnetic material, field drive coils provide rotational in-plane magnetic fields and surround the substrate. Means are also provided to interconnect the chips to one another, if there is more than one chip in the package, to control the circuitry for performing various bubble manipulations in the chips and to connect the memory to the outside world. It is, of course, desirable to maintain the space between these packaged components, ie., coils, chips, interconnect circuitry, etc. as small as possible for a number of reasons, including the reducing power requirements of the field drive coils. It is also recognized, however, that the largest source of heat in the package comes from the drive coils during the operation and that unless this heat is dissipated or controlled, the operating characteristics of the bias magnets and chips are materially and sometimes adversely affected. It is especially desirable to maintain the temperature of the bias magnets as close as possible, to the temperature of the chips so that the bias field will remain constant relative to the chips thus not disrupting the size or disposition of the bubbles.

It is also recognized that in addition to thermal control of the heat in the package, because of the desire to maintain the space between these packaged components as small as possible, manufacturing and packaging tolerances have become more critical and thus it is desirable to have the thermal control material also perform the function of aiding in the packaging of the components.

Accordingly, it is a primary object of this invention to provide a magnetic bubble package with means for controlling and dissipating the heat and for aiding in the packaging of the components.

SUMMARY AND AN ADDITIONAL OBJECT OF THE INVENTION

The package having bubble memory components which accomplishes the foregoing object comprises thermal compliant members disposed against the walls of the metallic housing and which engage the yoke for the bias magnets so as to conduct the heat generated by the field drive coils to the housing walls, and control the temperature of the bias magnets. The thermal compliant members are separate discrete components of resilient material mixed or impregnated with material which will determine the amount of heat conducted by the compliant members between the bias magnets and the housing. Thus, depending upon the selection of the material, the temperature of the bias magnets and the other components within the package can be managed. Also, the compliant members, being resilient, aid in the packaging of the components, by compensating for manufacturing tolerances.

The package is also provided with spacer means which are used to locate the chips relative to the bias magnets and with additional compliant members also being of thermally conductive material to engage the field drive coils to conduct the heat of the coils to the ambient air.

Accordingly, another object of this invention is to provide a magnetic bubble memory package with compliant thermal members which aid in the control, distribution, dissipation of the heat generated in the package as well as aid in the packaging of the components.

Still another object of this invention is to provide a magnetic bubble memory package with thermally conductive means which aid in the control, distribution and dissipation of heat generated in the package as well as function as means for locating/positioning components of the package.

BRIEF DESCRIPTION OF THE DRAWINGS

FIG. 1 is a perspective view, partially broken away, to show the various components of the bubble memory package and their relationship to one another; and FIG. 2 is a cross-sectional view of the invention of FIG. 1.

BRIEF DESCRIPTION OF THE PREFERRED EMBODIMENT

FIGS. 1 and 2 disclose, as a preferred embodiment of the invention, a package 10 of bubble memory components which includes an innerassembly of one or more magnetic bubble chips 12 disposed, by way of example, on a rigid substrate 14 forming part of a cabinet 16. The cabinet supports and spaces a pair of encompassing orthogonally oriented magnetic field generating drive coils 18 and 20 for propagating the bubbles within the chips. The substrate 14, preferably a printed circuit board, contains conductors for interchip communication and terminals 22 for external connection to the outside world via conductors 24.

A pair of relatively flat bias magnets 26 and 28 are fixed to legs 30 and 32 of the U-or closed shaped yoke 34. The yoke is conventionally of a relatively thin magnetically soft material to form the magnetic circuit for the bias magnets. These bias magnets are disposed on both sides of the innerassembly and as close as possible thereto for providing a suitable bias, normal to the plane of the substrate, for forming and maintaining the bubbles on the magnetic material within the chips 12.

Thermal compliant members 36 and 38 are located on the top and bottom of the substrate 14. These are provided with channels 40 and 42 which together form an opening on each side to permit access to the terminals on the substrate for connection of the conductors 24. On the side opposite of this opening the spacers engage the edges of the cabinet 16 and form cavity 44. Cavity 44 is itself filled with thermally loaded compliant members 46 and 48 which space the innerassembly relative to the magnets 26 and 28.

A metallic housing or container of parallelepiped configuration for the assembly of the components comprises a top wall 50 and a bottom cover 52 separated by side walls 54 (one shown in FIG. 1). In the embodiment disclosed the housing is open at end end as at 56. The material of the housing is selected for its thermal conductive, radiation and magnetic shielding qualities; typically a magnetically soft nickel iron alloy.

As aforesaid, a major source of heat during the operation of the bubble memory package is the heat generated by the drive coils for propagating the magnetic bubbles within the chips 12. Heretofore, this heat has adversely influenced the bias magnets and the bubbles in the magnetic material and, in general, caused a malfunction of the chip. As explained heretofore, this invention is directed to the solution of this problem. Also, recognizing the fact that it is very desirable to maintain the bias magnets as close as possible to the plane of the chips and to keep the drive coils likewise as close as possible to the chips, not only is the problem of heat accentuated, but the assembly of the package becomes exceedingly difficult due to variations in tolerance in, for example, a parallism of walls of the housing and the legs of the yoke.

To solve this problem a pair of thermal compliant members 58 and 60 are disposed on the outside of the yoke 34, that is, on the side of the yoke legs opposite the bias magnets 26 and 28. These thermal compliant members are relatively flat discrete parallelepiped units formed of a resilient material containing filler material for controlling the thermal conductive qualities of the members for dissipating/controlling the heat generated by the drive coils 18 and 20 during the operation of the chips.

The amount of heat controlled by the thermal compliant units and the resiliency thereof depends upon the composition of the material selected. It is to be noted that these units, being resilient, also perform the function of compensating for any misalignment of or tolerance variations in the parts during the final packaging.

The following table illustrates typical examples of compliant members and their composition.

| NAME (Density) | % LOAD (By wt.) | HARD- NESS (Shore A) | THERMAL CONDUCTIVITY (W/in. °C. ×10⁻³) |
| --- | --- | --- | --- |
| 1. Aluminum Oxide | — | — | 17.20 |
| $Al_2O_3$ + R6103 | 40 | 64 | 1.70 |
| $Al_2O_3$ + R6103 | 60 | 69 | 1.92 |
| $Al_2O_3$ + R6103 | 80 | 71 | 2.44 |
| $Al_2O_3$ + R6103 | 100 | 78 | 3.07 |
| $Al_2O_3$ + R6103 | 150 | 84.5 | 4.08 |
| 2. Zinc Oxide | — | — | 15.10 |
| ZnO + R6103 | 25 | 65 | 1.40 |
| ZnO + R6103 | 50 | 65 | 2.78 |
| ZnO + R6103 | 75 | 72 | 3.40 |
| ZnO + R6103 | 100 | 75 | 3.85 |
| 3. Lead Oxide | — | — | |
| $Pb_3O_4$ + R6103 | 25 | 58 | 5.48 |
| $Pb_3O_4$ + R6103 | 50 | 55 | 7.54 |
| $Pb_3O_4$ + R6103 | 75 | 51 | 10.51 |
| $Pb_3O_4$ + R6103 | 100 | 48 | 12.51 |
| 4. Ferric Oxide | — | — | 14.99 |
| $Fe_2O_3$ + R6103 | 25 | 63 | 1.55 |
| $Fe_2O_3$ + R6103 | 50 | 66 | 1.67 |
| $Fe_2O_3$ + R6103 | 75 | 69 | 1.89 |
| 5. Boron Nitride | — | — | |
| BN + R6103 | 10 | 62 | 1.78 |
| BN + R6103 | 25 | 66 | 2.37 |
| BN + R6103 | 40 | 72 | 2.81 |
| BN + R6103 | 50 | 75 | 3.00 |

The foregoing material comprises powder mixed with a Dow Corning silicone R-6103 and it is to be noted that, when lead oxide is used, the hardness of the material is significantly reduced.

The foregoing samples show that by the selection of the filler material and the resilient material the heat generated by the coils can be managed. The particular material and filler can be selected by those skilled in the art once having understood the herein described invention. Also, these discrete units can be selected according to their thicknesses and resiliency and any variations in the tolerances of the bias magnets, or the packaging material of the innerassembly, or out of parallelism of the top and bottom walls of the container or housing can be compensated for when the components are assembled into a package. Since the closeness of the various components is critical, these compliant members obviously facilitate packaging.

Also as mentioned above, the thermal members 36 and 38, being in engagement with the coils 18 and 20, as at 62 and 64, are utilized as thermal control members and, by being made of suitable thermal conductive material, heat generated by the coils may be conducted away into the ambient air; it being noted that the members 36 and 38 extend to the outer end of the housing for this purpose. The thermal conductive material selected may be from the table above and can be the same material as the compliant members 58 and 60. Too, spacer members 46 and 48 are likewise of thermal compliant material from the above table. These like members 36, 38 and 58, 60 can be of the same material or different depending on the thermal management needs of the package.

Finally, after the assembly of components thus far described, they are installed in the housing through openings 56 utilizing the resilient compliant members to compensate for any misalignment or tolerance errors. A slight compression of the compliant members may be necessary for insertion of the components in the openings 56. The ends 56 are then filled with an epoxy as at 66 leaving, of course, the ends of the spacer members free for radiation of the heat. This epoxy, is, for example, Cummings SC-CPC-41.

What is claimed is:

1. A magnetic bubble package having an assembly of magnetic bubble memory components comprising,
bubble memory chip means mounted on a substrate,
said substrate containing electrical conductors,
a plurality of drive coils for providing a magnetic field rotating in the plane of said chip means,
yoke means with bias magnets on each leg thereof and located with respect to the drive coils and said chip means to provide a magnetic field normal to the plane of said chip means,
first heat control means made of material selected for their thermal conductive qualities and positioned on said substrate and in engagement with means surrounding said bubble memory chip and bias magnets and serving to space said bubble memory chip means from said bias magnets,
said first heat control means also engaging a portion of said drive coils for transferring heat generated by said drive coils away from said coils,
a housing made of a material selected for its thermal conductive, radiation and magnetic shielding qualities and partially enclosing said subassembly, and
second heat control means comprising discrete members made of materials selected for their thermal conductive and resilient qualities and located in engagement with each leg of said yoke means opposite said bias magnets and engaging said housing.

2. The magnetic bubble memory package as claimed in claim 1 wherein said first heat control means comprises discrete members which engage said substrate and have one side which engages said drive coils and wherein pairs of said discrete members on the side opposite the coils form openings to accommodate terminals and conductors for connecting said chip to outside sources.

3. The magnetic bubble package as claimed in claim 1 wherein said second heat control means, being resilient, compensate for any misalignment among the components of said assembly.

4. The magnetic bubble package as claimed in claim 3 wherein the material selected for said first heat control means comprises silicone mixed with lead oxide.

5. The magnetic bubble package as claimed in claim 3 wherein the material selected for said first heat control means comprises silicone mixed with aluminum oxide.

6. The magnetic bubble package as claimed in claim 3 wherein the material selected for said first heat control means comprises silicone mixed with zinc oxide.

7. The magnetic bubble package as claimed in claim 3 wherein the material selected for said first heat control means comprises silicone mixed with ferric oxide.

8. The magnetic bubble memory package as claimed in claim 3 wherein the material selected for said first heat control means comprises silicone mixed with boron oxide.

9. The magnetic bubble memory package as claimed in claim 3 wherein said second heat control means comprises the same material as that selected for said first heat control means.

10. The magnetic bubble package as claimed in claim 1 wherein said housing is open ended and first heat control means extends to the open ends of said housing for transferring the heat generated by said drive coils to the ambient air.

11. The magnetic bubble memory package as claimed in claim 10 further including thermally conductive spacer means between said bias magnetis and said coils to space the coils relative to said bias magnets.

12. The magnetic bubble memory package as claimed in claim 11 wherein said spacer means are of the same material as that selected for said first heat control means and engage said first heat control means.

* * * * *